United States Patent
Clauss

(10) Patent No.: US 6,914,248 B2
(45) Date of Patent: Jul. 5, 2005

(54) PARTICLE-OPTICAL APPARATUS AND METHOD FOR OPERATING THE SAME

(75) Inventor: Wilfried Clauss, Oberkochen (DE)

(73) Assignee: Carl Zeiss NTS GmbH, Oberkkochen (DE)

(*) Notice: Subject to any disclaimer, the term of this patent is extended or adjusted under 35 U.S.C. 154(b) by 0 days.

(21) Appl. No.: 10/631,900

(22) Filed: Aug. 1, 2003

(65) Prior Publication Data

US 2004/0061067 A1 Apr. 1, 2004

(30) Foreign Application Priority Data

Aug. 2, 2002 (DE) .......................................... 102 35 455

(51) Int. Cl.$^7$ ............................................. H01J 37/141
(52) U.S. Cl. ............................. 250/396 ML; 335/210; 335/217
(58) Field of Search ................................. 250/396 ML

(56) References Cited

U.S. PATENT DOCUMENTS

| | | | |
|---|---|---|---|
| 4,246,128 A | 1/1981 | Gallagher et al. | |
| 4,376,249 A | 3/1983 | Pfeiffer et al. | |
| 4,817,706 A | 4/1989 | Harumi et al. | |
| 5,629,526 A | 5/1997 | Nakasuji | |
| 5,738,949 A | 4/1998 | Schaner et al. | |
| 6,011,268 A | 1/2000 | Nakasuji | |
| 6,188,071 B1 | 2/2001 | Gordon et al. | |
| 6,217,789 B1 | 4/2001 | Inoue et al. | |
| 6,297,634 B1 | 10/2001 | Aoki | |
| 6,566,663 B1 * | 5/2003 | Kamijo et al. | 250/492.2 |
| 2002/0084422 A1 * | 7/2002 | Kienzle et al. | 250/396 ML |
| 2003/0066961 A1 | 4/2003 | Kienzle et al. | |

FOREIGN PATENT DOCUMENTS

| | | |
|---|---|---|
| DE | 100 44 199 A1 | 6/2002 |
| EP | 0 461 366 A2 | 12/1991 |
| JP | 64-017364 A | 1/1989 |
| JP | 2001230190 A | 8/2001 |
| JP | 2001307975 A | 11/2001 |
| JP | 2002170761 A | 6/2002 |

OTHER PUBLICATIONS

X, Zhu et al., "Comprehensive Analysis of Electron Optical Design of SCALPEL–HT/Alpha", Proc. SPIE, vol. 3997, pp. 170–183, Jul. 2000, Emerging Lithographic Technologies IV, Elizabeth A. Dobisz, Ed.

Eichi Goto et al., "*MOL* (*moving objective lens*) *Formulation of deflective aberration free system*," OPTIK, vol. 48, No. 3, pp. 255–270 (1977), Wissenschaftliche Verlagsgesellschaft mbH, Stuttgart, Germany.

* cited by examiner

*Primary Examiner*—John R. Lee
*Assistant Examiner*—Phillip A Johnston
(74) *Attorney, Agent, or Firm*—Jones Day

(57) ABSTRACT

A particle-optical apparatus is proposed as well as a method for operating the same. The particle-optical apparatus provides a magnetic field for deflecting charged particles of a beam of charged particles and comprises a body of a material with a permeability number around which a current conductor at least partially engages and a temperature-adjusting unit for adjusting a temperature of the magnetic-flux-carrying body substantially to a nominal temperature. A relative variation of the permeability number relative to a width of a temperature range is to be smaller than a limit value a, wherein a is preferably smaller than $3 \cdot 10^{-3} K^{-1}$. In particular, the nominal temperature is at an extremum of a temperature dependence of the permeability number. Preferably, such a particle-optical apparatus can be employed in a microscopy or a lithography apparatus.

22 Claims, 4 Drawing Sheets

PARTICLE-OPTICAL APPARATUS AND METHOD FOR OPERATING THE SAME

BACKGROUND OF THE INVENTION

1) Field of the Invention

The present invention relates to a particle-optical apparatus for manipulating a beam of charged particles, a method for operating such a particle-optical apparatus, a microscopy system and a lithography system.

2) Brief Description of Related Art

The particle-optical apparatus provides a magnetic field which the beam to be manipulated traverses. This manipulation may include a focusing, a deflection, a conversion of the beam or the like.

Magnetic field configurations are known from the prior art which have a focusing, deflecting or converting effect on a beam of charged particles.

For example, a beam deflector is known from U.S. Pat. No. 6,188,071 B1 for use in a lithography system. Here, a beam traversing the apparatus is an electron beam which is used as writing beam of the lithography system. A resolution of the lithography method performed therewith is thus determined also by the accuracy with which the deflection or/and focusing of the writing beam is performed in the apparatus. The apparatus comprises ferrite bodies for carrying the magnetic fields produced by current conductor windings. It is a property of ferrite materials that their magnetic permeability is temperature-dependent. Accordingly, if the temperature of the ferrite body changes, its magnetic property will also change and, correspondingly, the effects which the apparatus exerts on the writing beam traversing the same will change with temperature variations. According to U.S. Pat. No. 6,188,071 B1, a temperature control is provided to stabilize the temperature of the ferrite body in order to reduce influences of temperature on the quality of the lithographic process. It is also recognized in the document that the temperature regulation might, under certain circumstances, be too slow to sufficiently suppress temperature changes in the ferrite body. Therefore, the conventional apparatus comprises an additional correcting coil with low inductivity to actively compensate for the influences of the temperature dependence of the permeability of the ferrite material on the beam which are not completely suppressed by the temperature control.

SUMMARY OF THE INVENTION

It has been found that it is not easy to suppress temperature influences on the ferrite material. Accordingly, it is an object of the present invention to provide a particle-optical apparatus with a magnetic-flux-carrying body, such as a ferrite, wherein temperature changes in the magnetic-flux-carrying body have less influence on a beam of charged particles to be manipulated by the apparatus. Moreover, it is an object of the invention to provide a method for operating such apparatus. A further object of the invention is to provide an electron microscopy system and/or a lithography system wherein relatively good imaging properties are achievable.

The invention proceeds from a particle-optical apparatus for providing a magnetic field for manipulating a beam of charged particles which comprises: a magnetic-flux-carrying body made of a material having a high permeability number, at least one current conductor engaging at least partially around the magnetic-flux-carrying body and a temperature-adjusting unit for adjusting a temperature of the magnetic-flux-carrying body substantially to a nominal or target temperature.

The invention takes into account the fact that the permeability number of the magnetic-flux-carrying body always depends on temperature. In order to reduce influences exerted by temperature changes in the magnetic-flux-carrying body on the manipulation of the beam, the temperature-adjusting unit is accordingly provided for stabilizing the magnetic-flux-carrying body substantially to the nominal or target temperature. Here, too, the invention takes further into account the fact that such a temperature-adjusting unit, be it a temperature-adjusting-unit with or without feed-back control, will not be able to perfectly prevent temperature variations in the magnetic flux-carrying body. At this point, the concept which the invention is based upon sets in, namely to select the nominal or target temperature of the magnetic-flux-carrying body such that it is in a temperature range in which the permeability number of the material of the magnetic-flux-carrying body has relatively low temperature dependent changes.

If temperature changes occur in such a range, they have thus a relatively small influence on the permeability number and thus on the effect exerted by the particle-optical apparatus on the beam traversing the same.

A temperature range in which the permeability number has relatively low changes is a range in which a graph which represents the dependence of the permeability number on the temperature exhibits a relatively flat slope. Accordingly, such a range can be characterized by the following formula:

$$\frac{\mu_{max} - \mu_{min}}{\mu_{max} \cdot \Delta T} = c,$$

wherein $c < 3 \cdot 10^{-3}$ $K^{-1}$.

Here, $\mu_{max}$ is a maximum value of the permeability number in the temperature range, $\mu_{min}$ is a minimum value of the permeability number in the temperature range and $\Delta T$ is a width of the temperature range.

In order to achieve a particularly small temperature dependence of the permeability within the temperature range in which the nominal temperature is under practical conditions, c is preferably selected to be $c < 9 \cdot 10^{-4}$ $K^{-1}$, preferably, $c < 3 \cdot 10^{-4}$ $K^{-1}$, more preferred, $c < 9 \cdot 10^{-5}$ $K^{-1}$, even more preferred, $c < 3 \cdot 10^{-5}$ $K^{-1}$. Further preferred are even smaller values of c, namely $c < 9 \cdot 10^{-6}$ $K^{-1}$, in particular, $c < 3 \cdot 10^{-6}$ $K^{-1}$ and, even more preferred, $c < 1 \cdot 10^{-6}$ $K^{-1}$.

A particularly favorable independence of temperature variations is achieved if the nominal or target temperature is adjusted such that the temperature dependence of the permeability number of the material of the magnetic-flux-carrying body has an extremum at this nominal temperature. The extremum can be a maximum or a minimum.

According to the invention, the above-described particle-optical apparatus and the method for operating the same are preferably employed in a lithography system or/and a microscopy system.

Embodiments of the invention are described hereinbelow with reference to drawings, wherein:

DETAILED DESCRIPTION OF EXEMPLARY EMBODIMENTS

Figure 1:
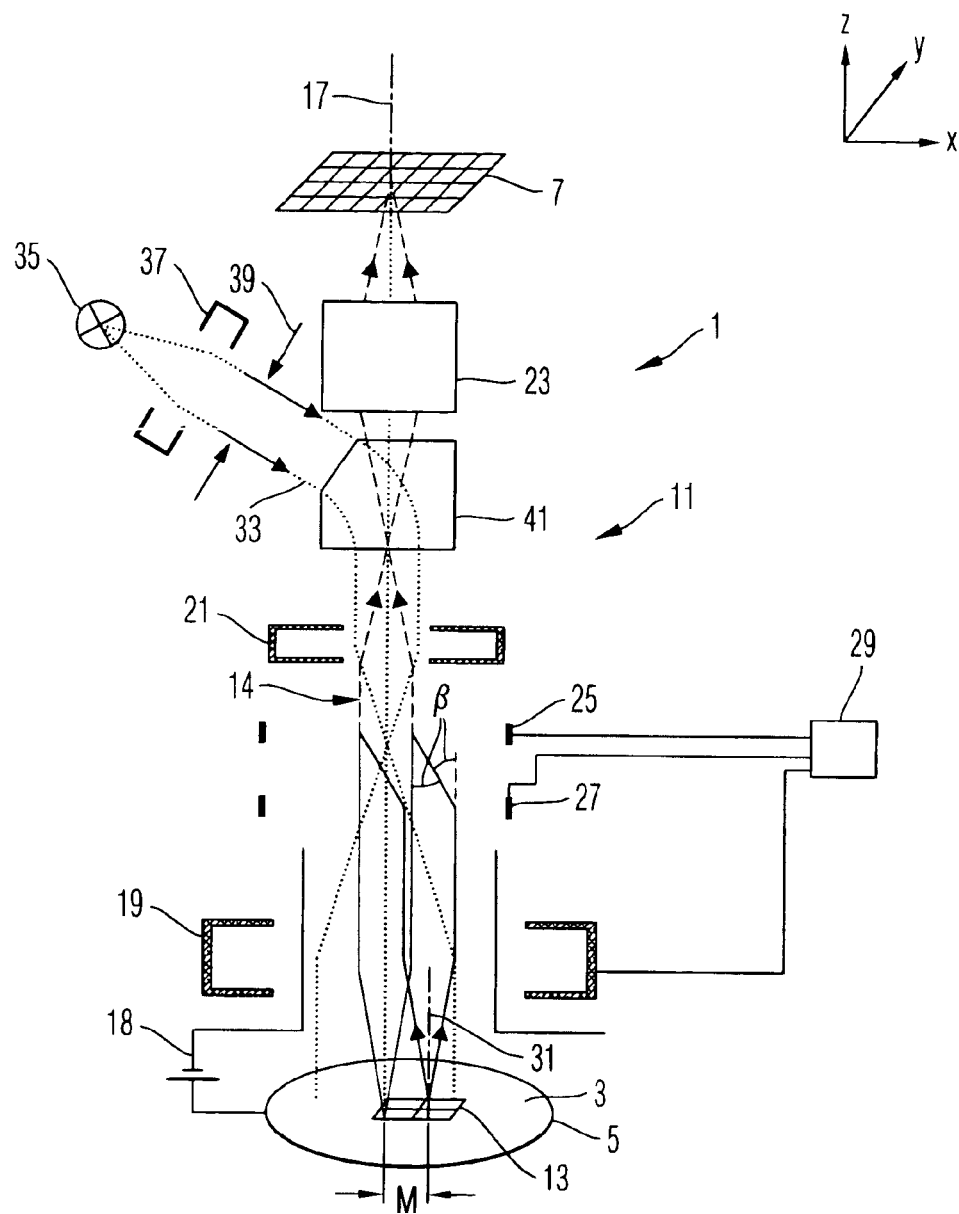
FIG. 1 shows an electron microscopy system according to an embodiment of the invention.

FIG. 1 schematically shows a microscopy system 1 for imaging a semiconductor wafer 5 positioned in an object plane 3 of the microscopy system 1 onto a position-sensitive detector 7. To this end, the microscopy system 1 comprises a microscopy optics 11 which provides a beam path for secondary electrons to electron-optically image a region 13 of the object plane 3 onto the detector 7. The beam path used for imaging the region 13 which is imaged onto the detector 7 is displaceable parallel to an optical axis 17 of the microscopy system 1 (in FIG. 1 a displacement is designated by M).

The microscopy optics 11 comprises a plurality of components which are symmetrically disposed centrally in respect of the optical axis 17, namely an objective lens 19, a field lens 21 and a further magnification optics 23. Between the objective lens 19 and the field lens 21, there are provided two beam deflectors 25 and 27 spaced apart from each other along the optical axis 17. The deflectors 25, 27 are controlled by a controller 29. Each one of the beam deflectors 25, 27 provides for the secondary electron beam 14 an adjustable deflection angle β controllable by the controller 29, the deflection angles provided by the two beam deflectors 25, 27 being, however, opposite in sign. Accordingly, the secondary electron beam 14 passes through the two lenses 19, 21 straightly, however, adjustably displaced parallel to the optical axis 17.

The secondary electrons extracted from the semiconductor wafer 5 are accelerated by an extraction electrode 18 in a direction parallel to the optical axis 17.

The objective lens 19 provides a focusing field for the secondary electron beam 14, the optical axis 31 of which is displaceable relative to the optical axis 17 of the other components. The controller 29 controls the objective lens 19 such that the optical axis 31 of the objective lens 19 vertically intersects centrally the region 13 of the object plane 3 which is imaged on the detector 7. An example of such an objective lens is described in the article "MOL" ("moving objective lens"), Optik 48 (1977), no. 2, pages 255–270, by E. Goto et al., or in U.S. Pat. No. 4,376,249. A further example of such an objective lens is described in U.S. Pat. No. 2003/0066961 A1 of the assignee of the present application.

The secondary electrons are extracted from the semiconductor wafer 5 by a primary electron beam 33 which is generated by an electron source 35, which is collimated by a collimating lens 37 and shaped by an aperture stop 39 and supplied to a beam combiner/beam splitter 41. The beam combiner 41 superimposes the primary electron beam 33 on the beam path of the secondary electron beam 14. The primary electron beam 33 passes through the field lens 21, the deflectors 25, 27 and the objective lens 19. The primary electron beam 33 is also deflected by the deflectors 25, 27, however, not necessarily exactly by the same angle as the secondary electron beam 14. However, it is sufficient for the primary beam 33 to illuminate the field 13 imaged onto the detector 7 merely fairly homogenously. Accordingly, the demands put on the imaging properties of the optical system 11 are less for the primary electron beam 33 than for the secondary electron beam 14.

Figure 2:
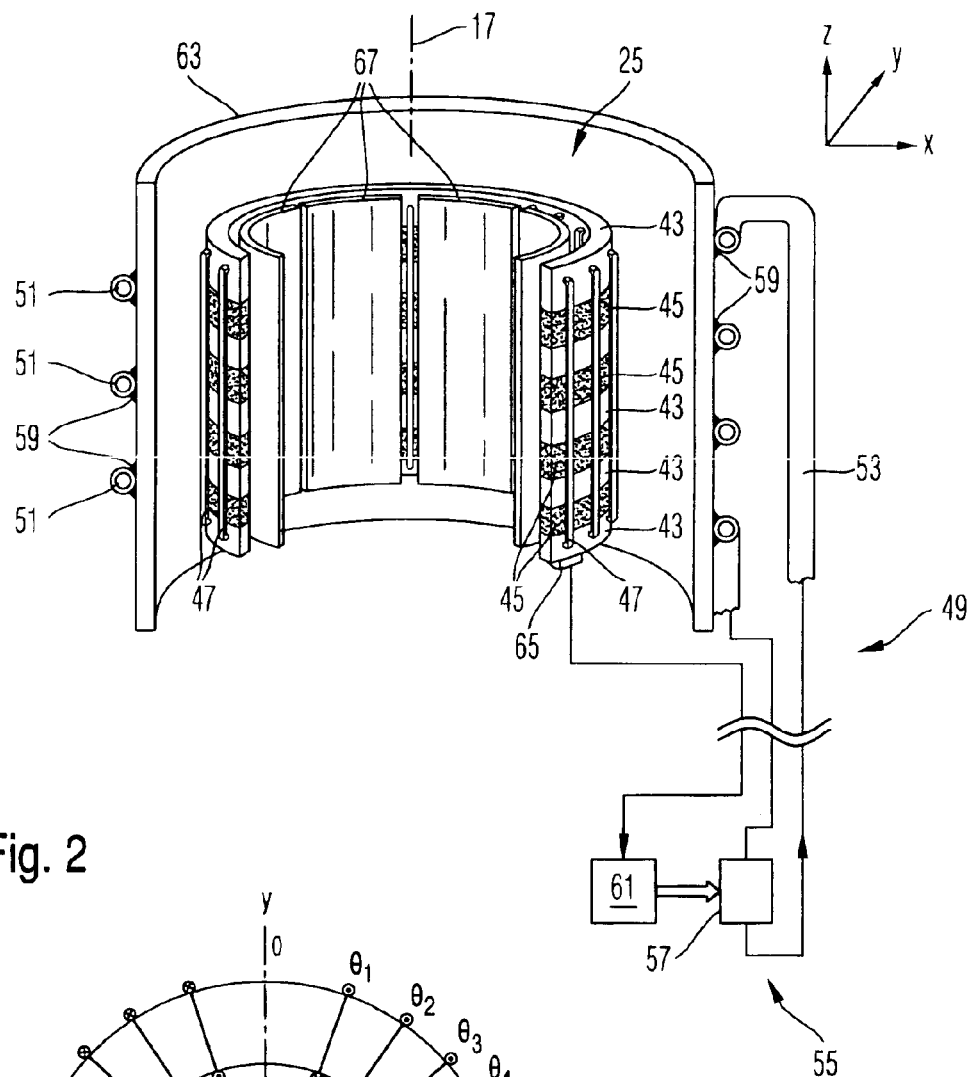
FIG. 2 is a perspective partial view of a beam deflector according to an embodiment of the invention which may be used in the microscopy system of FIG. 1.

FIG. 2 schematically shows the deflector 25 in perspective partial view. It comprises a plurality of rings 43 disposed concentrically in respect of the optical axis 17 and made of a material with a low permeability number, and a plurality of rings 45 which are made of a material with a high permeability number and are disposed between adjacent rings 43 made of the material with the low permeability number. The rings 43, 45 are thus alternately disposed on each other as a stack. Current conductors 47 engage around the rings 43, 45, which current conductors extend substantially parallel to the optical axis 17 and radially penetrate the uppermost and lowermost rings 43.

Figure 3:
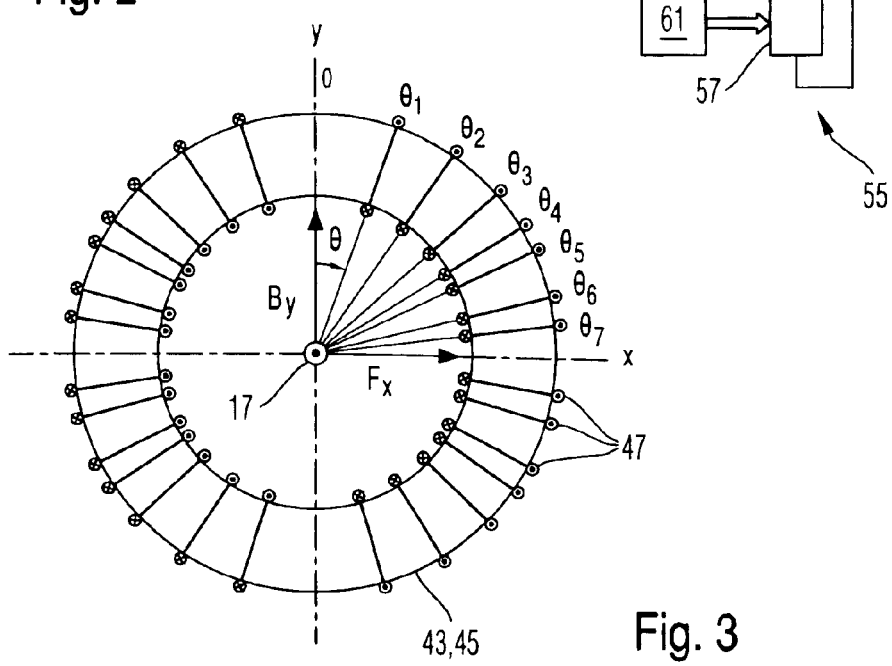
FIG. 3 is a plan view on the beam deflector shown in FIG. 3.

FIG. 3 shows the arrangement of the current conductor windings in circumferential direction around the optical axis 17. The angles $\Theta_1$ to $\Theta_7$ indicated in FIG. 3 have the following values: $\Theta_1=21.6°$, $\Theta_2=41.6°$, $\Theta_3=47.6°$, $\Theta_4=62.4°$, $\Theta_5=68.4°$, $\Theta_6=78.5°$ and $\Theta_7=84.5°$. These angles are selected such that the magnetic field generated by the current conductor windings 47 is a substantially homogeneous magnetic field oriented in y-direction.

By exciting the current conductor windings 47 with a current adjusted by the controller 29, it is thus possible to deflect the secondary electron beam in x-direction by adjustable angles β.

The rings 43 with the low permeability number can be made of a material called Macor® which is obtainable from Corning, Inc., New York, USA.

The rings 45 made of the material with the high permeability number are made of a manganese/zinc/ferrite material which is obtainable from Ceramic Magnetics, Inc., New Jersey, USA under the product name MN-60 for example.

Figure 4:
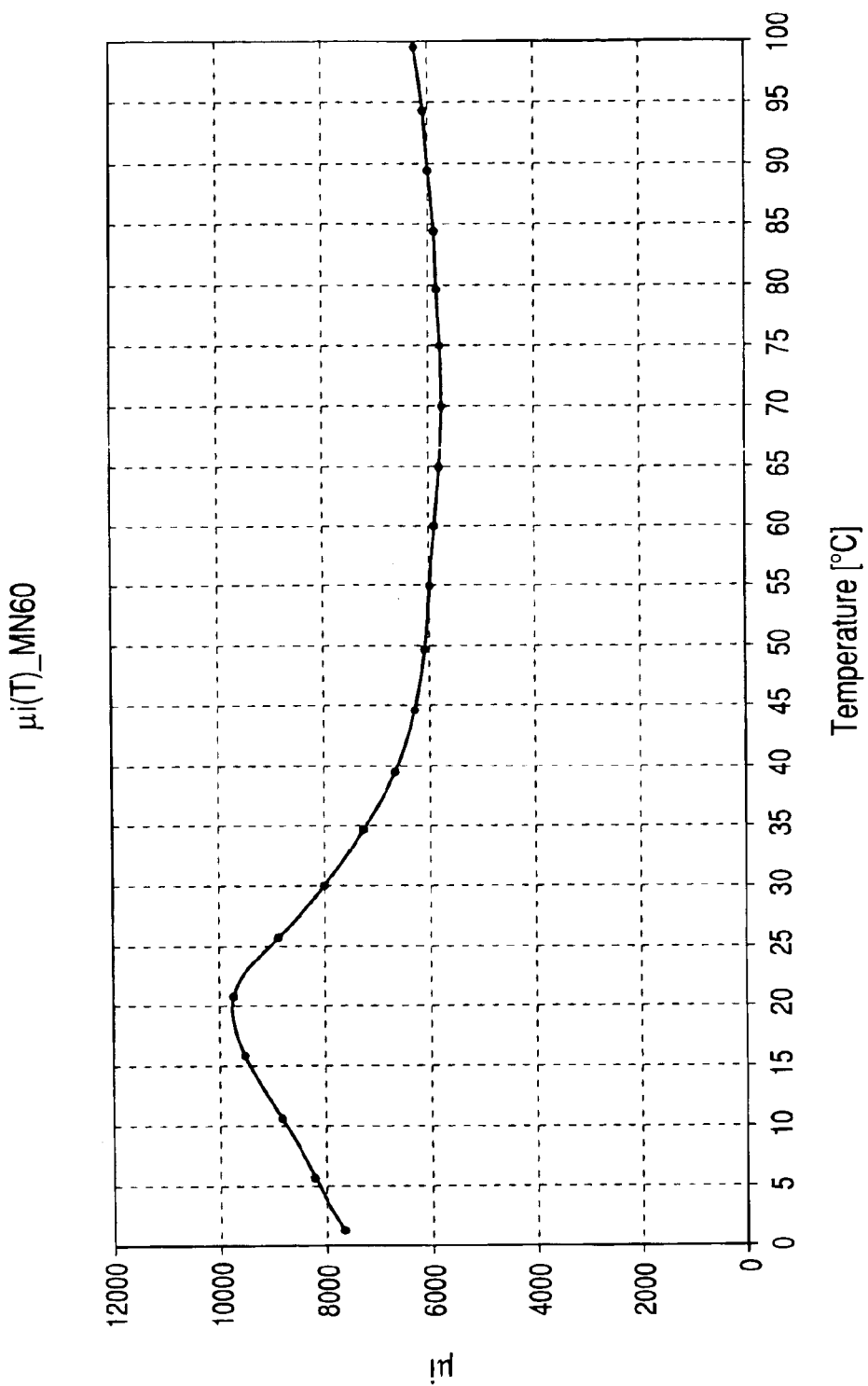
FIG. 4 shows a graph showing the temperature dependence of a ferrite material which may be used in the beam deflector according to FIGS. 2 and 3.

The permeability number of this material is dependent upon the temperature. FIG. 4 shows a graph of this dependency for a sample of this material. It is evident therefrom that the permeability number has a maximum at a temperature of about 20° C. and a minimum at a temperature of about 75° C. At a temperature in a range of from 25° to 40° C. in which operating temperatures of technical apparatuses normally lie the temperature dependence shows a relatively steep slope. Even if one tries to actively stabilize the temperature of the rings 45 in this range by means of a temperature-adjusting unit, inevitable temperature variations nevertheless result in changes in the permeability number of the rings 45. According to the invention, the temperature of the rings 45 is thus adjusted to a nominal temperature which is in a temperature range in which there are only small temperature-dependent variations in the permeability number and which is preferably at an extremum of the temperature dependency of the permeability number, i.e., either to a temperature of about 20° or a temperature of about 75°.

To this end, a temperature-adjusting unit 49 schematically shown in FIG. 2 is provided. It comprises plural windings 51 of a conduit 53 through which a liquid flows, for example, water. The liquid flows through the conduit 53 in a closed circuit 55 which passes through a heating/cooling unit 57 in which the liquid flowing through the conduit 53 is brought to a temperature which is adjustable by a controller 61. The windings 51 of the conduit 53 abut with a heat contact 59 against a beam tube 63 which forms part of a vacuum chamber of the particle optics 11.

The beam deflector 25 is disposed within the beam tube 63 in the region in which the windings 51 are wound around the outside of the beam tube 63. This allows a heat exchange between the beam tube 63 and the deflector 25 to take place by thermal radiation transfer. By adjusting the temperature of the medium flowing through the windings 51 by means of the heating/cooling unit 57, it is thus possible to adjust the temperature of the ferrite rings 45 of the beam deflector 25 in a range about the nominal temperature. This adjustment is effected through a feed-back control which comprises a sensor 65 fixed to the stack of rings 43, 45 and read out by the controller 61. Accordingly, the controller 61 can compare an actual temperature of the rings 43, 45 with the nominal temperature thereof and accordingly influence the temperature of the medium in the windings 51 via the cooling/heating unit 57.

In the temperature-adjusting unit shown in FIG. 2, the ferrite rings 45 are adjusted to a nominal temperature of 20° C., since at this temperature the material used for the rings 45 shows a maximum of the permeability number (see FIG. 4). As an alternative thereto, it is possible to select as the nominal temperature a value about 75° C. at which the permeability number of the material used for the rings 45 has a minimum. It is evident from FIG. 4 that at this temperature the extremum (minimum) has a considerably flatter shape than the extremum (maximum) at the temperature of 20° C. The permeability number can thus be held more accurately around the extremum at the nominal temperature of 75° C. than at the nominal temperature of 20° C. On the other hand, at the minimum at the higher temperature of 75° C., the value of the permeability number is considerably lower than at the maximum at 20° C., so that the magnetic effect of the ferrite rings 45 is correspondingly reduced at this temperature.

The beam deflector 25 further comprises sector electrodes 67 which are disposed radially within the rings 43, 45. They provide an additional electric deflecting field for the beam traversing the deflector 25, which deflecting field is superimposed with the magnetic field provided by the beam conductors 47. Accordingly, the deflectors 25, 27 can be operated as a Wien filter, and deflection angles β provided by the deflectors 25, 27 can thus be adjusted with additional degrees of freedom. In particular, the magnetic fields and the electric fields provided for the deflection can be adjusted such that substantially the same deflection angles β result for both the primary electrons and the secondary electrons.

The beam conductors 47 are energized such that the magnetic flux in the ferrite rings 45 is well below a saturation value, such that changes in the magnetic field have a substantially linear dependency from variations of an energizing current. For example, a maximum flux induced in the ferrite rings 45 may be below 25% of a saturation flux therein, or in particular below 15% or even below 10%. Further, the energizing current may be an AC current such that an orientation of the magnetic flux carried by the ferrite rings changes from time to time or periodically.

A variant of the embodiment described with reference to FIGS. 1 to 4 will now be described. Components which correspond in function or structure to components of FIGS. 1 to 4 are designated by the same reference numbers, however, supplemented by an additional letter for the purpose of distinction. Reference is made to the entire above description.

Figure 5:
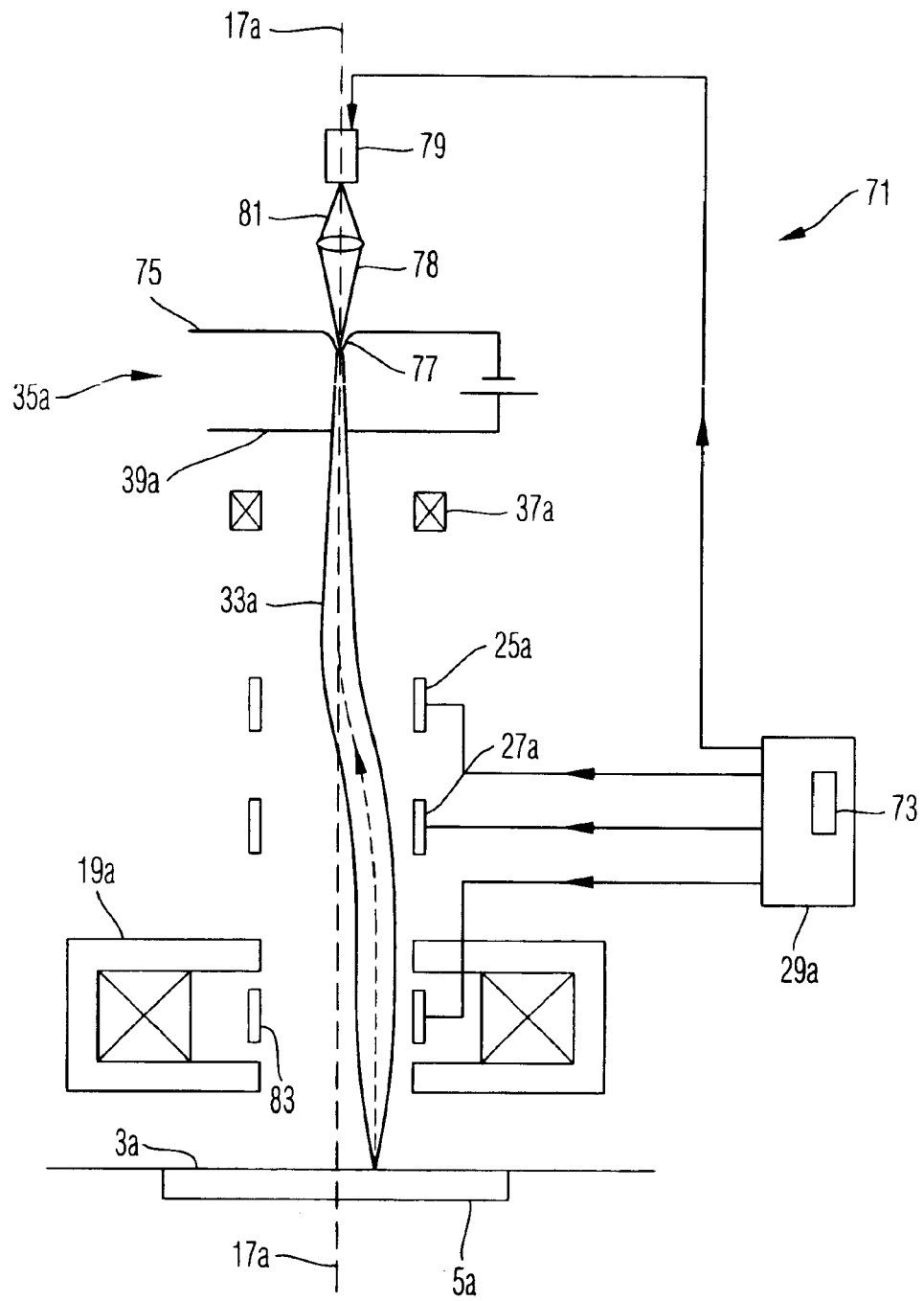
FIG. 5 shows a lithography system according to an embodiment of the invention in which the beam deflectors according to FIGS. 2 and 3 may be used.

FIG. 5 schematically shows a lithography system 71 used for transferring a pattern stored in a memory 73 of a controller 29a onto a particle-sensitive layer or resist with which a surface 3a of a semiconductor wafer 5a is coated in a lithography process for manufacturing miniaturized semiconductor structures.

The transfer of the pattern is effected by means of a writing electron beam 33a. It is generated by an electron source 35a which comprises a cathode plate 75 which has a tip 77 embossed therein. The tip 77 is disposed opposite to a bore of an aperture stop 39a which is biased in respect of the cathode plate 75 as anode. Furthermore, the tip 77 is disposed on an optical axis 17a of the lithography system 71 and is illuminated from above by a laser beam 78 generated by a semiconductor laser 79 and collimated by a collimating lens 81 into the tip 77. By controlling the laser 79 via the controller 29a, it is possible to rapidly switch the laser beam 78 on and off. The laser beam 78 supports a photon-assisted field emission in the region of the tip 77, as a result of which electrons are extracted from the tip 77 and accelerated through the aperture stop 39a to form the writing electron beam 33a which, after having passed through the aperture stop 39a, passes through a collimating lens 37a.

The collimating lens 37a further forms the writing electron beam 33a to a substantially parallel beam travelling along the optical axis 17a. This beam successively passes through two deflectors 25a and 27a concentrically disposed in respect of the optical axis 17a and then enters an objective 19a which finely focuses the same on the semiconductor surface 3a or object plane of the lithography system 71. The structure of the deflectors 25a and 27a is similar to that of the beam deflectors described with reference to FIGS. 2 and 3. Furthermore, a coil 83 likewise controlled by the controller 29a is disposed within the objective lens 19a, which itself is rotationally symmetric to the optical axis 17a. The coil superimposes a dipole field with the focusing field of the objective lens 19a in order to displace the optical axis of a focussing effect of the objective 19a away from the optical axis 17a such that it coincides with the center of the writing electron beam 33a displaced from the optical axis by the deflectors 25a, 27a. The deflectors 25a, 27a, and the coil 83 within the lithography system 71 can also be configured as described with reference to FIGS. 2 and 3, wherein electrodes (reference number 67 in FIG. 2) are not necessarily disposed within the magnetic deflectors and the coil, respectively.

In order for the pattern stored in the memory 73 to be transferred to the surface 3a of the wafer 5a, the controller 29a thus controls the deflectors 25a, 27a and the coil 83 as well as the laser 79 such that the writing electron beam 33a is moved across the surface 3a as desired and is switched on and off as required.

The electron microscopy system which has been described with reference to FIG. 1 images an extended region of the object surface onto a position-sensitive detector, for example, a CCD chip. Such an electron microscopy system is usually referred to as a LEEM (low energy electron microscope) or SEEM (secondary electron emission microscope). However, it is also possible to use the concept on which the invention is based, namely to stabilize a magnetic-flux-carrying material to such a temperature at which the temperature dependence of the permeability number thereof is small or has an extremum, to other types of electron microscopes. An example of this is a SEM (scanning electron microscope).

The lithography system described with reference to FIG. 5 is a "mask-less" lithography system wherein the writing beam is switched on and off via a beam source. However, it is also possible to realize the concepts of the invention in a lithography system wherein a mask or reticle is used for the definition of the pattern to be transferred.

In the above-described embodiments, the magnetic-flux-carrying body which is stabilized to a correspondingly selected nominal temperature is disposed in a particle-optical apparatus which serves as beam deflector. However, it is also possible to adjust the magnetic-flux-carrying body to a selected temperature in other particle-optical apparatuses. Examples of this are particle-optical apparatuses which act as focusing lenses or correction members, such as a hexapole field generating members or the like.

On the other hand, if a operating temperature of a particle-optical apparatus is predetermined, a ferrite material can be suitably selected. The temperature dependence of a ferrite material is dependent upon a composition thereof. Therefore, it is preferred to use or design a ferrite material which exhibits only slight permeability variations in a temperature range about the operating temperature.

The electron microscopy system described with reference to FIG. 1 and the lithography system illustrated with reference to FIG. 5 each operate with one primary electron beam and writing beam, respectively. However, it is also possible to use plural primary beams and writing beams, respectively, in parallel with to each other in such apparatuses.

The present invention has been described by way of exemplary embodiments to which it is not limited. Variations and modification will occur to these skilled in the art which do not depart from the scope of the present invention as recited in the claims appended hereto.

What is claimed:

1. A method of manipulating charged particles of a beam of charged particles by a magnetic field, the method comprising:

operating a magnetic field generating apparatus having a magnetic-flux-carrying body made of a material with a high permeability number, and at least one current conductor located adjacent to the magnetic-flux-carrying body, and operating the magnetic-flux-carrying body at an operating temperature, wherein the permeability number of the material is temperature dependent, and the material and the operating temperature are chosen such that the operating temperature is within a temperature range, in which the following applies:

$$\frac{\mu_{max} - \mu_{min}}{\mu_{max} \cdot \Delta T} = c, \text{ with } c < 3 \cdot 10^{-5} K^{-1}$$

wherein $\mu_{max}$ is a maximum value of the permeability number in the temperature range, $\mu_{min}$ is a minimum value of the permeability number in the temperature range, and $\Delta T$ is a width of the temperature range.

2. The method according to claim 1, wherein c is less than $9 \cdot 10^{-6} K^{-1}$.

3. The method according to claim 1, wherein c is less than $3 \cdot 10^{-6} K^{-1}$.

4. The method according to claim 1, wherein c is less than $1 \cdot 10^{-6} K^{-1}$.

5. A method of manipulating charged articles of a beam of charged articles by a magnetic field, the method comprising:

operating a magnetic field generating apparatus having a magnetic-flux-carrying body made of a material with a high permeability number, and at least one current conductor located adjacent to the magnetic-flux-carrying body, and operating the magnetic-flux-carrying body at an operating temperature wherein the permeability number of the material is temperature dependent, and the material and the operating temperature are chosen such that the operating temperature is within a temperature range, in which the following applies:

$$\frac{\mu_{max} - \mu_{min}}{\mu_{max} \cdot \Delta T} = c, \text{ with } c < 3 \cdot 10^{-4} K^{-1}$$

wherein $\mu_{max}$ is a maximum value of the permeability number in the temperature range, $\mu_{min}$ is a minimum value of the permeability number in the temperature range, and $\Delta T$ is a width of the temperature range, wherein a temperature dependency of the permeability number of the material has an extremum in the temperature range, and wherein the operating temperature is substantially a temperature at which the temperature dependency has the extremum.

6. The method according to claim 1, wherein the permeability number of the material is higher than 5,000.

7. The method according to claim 1, wherein the permeability number of the material is higher than 8,000.

8. The method according to claim 1, wherein the permeability number of the material is higher than 10,000.

9. A particle optical system having a particle-optical apparatus for providing a magnetic field for manipulating charged particles of a beam of charged particles, the particle-optical apparatus comprising:

a magnetic-flux-carrying body made of a material with a high permeability number, at least one current conductor located adjacent to the magnetic-flux-carrying body, and a temperature-adjusting unit configured for adjusting a temperature of the magnetic-flux-carrying body substantially to a nominal temperature, wherein the permeability number of the material is temperature-dependent and the nominal temperature is within a temperature range, in which the following applies:

$$\frac{\mu_{max} - \mu_{min}}{\mu_{max} \cdot \Delta T} = c, \text{ with } c < 3 \cdot 10^{-5} K^{-1}$$

wherein $\mu_{max}$ is a maximum value of the permeability number in the temperature range, $\mu_{min}$ is a minimum value of the permeability number in the temperature range, and $\Delta T$ is a width of the temperature range.

10. A particle optical system having a particle-optical apparatus for providing a magnetic field for manipulating charged particles of a beam of charged particles, the particle-optical apparatus comprising:

a magnetic-flux-carrying body made of a material with a high permeability number, at least one current conductor located adjacent to the magnetic-flux-carrying body, and a temperature-adjusting unit configured for adjusting a temperature of the magnetic-flux-carrying body substantially to a nominal temperature, wherein the permeability number of the material is temperature-dependent and the nominal temperature is within a temperature range, in which the following applies:

$$\frac{\mu_{max} - \mu_{min}}{\mu_{max} \cdot \Delta T} = c, \text{ with } c < 3 \cdot 10^{-4} \text{K}^{-1}$$

wherein $\mu_{max}$ is a maximum value of the permeability number in the temperature range, $\mu_{min}$ is a minimum value of the permeability number in the temperature range, and $\Delta T$ is a width of the temperature range, wherein a temperature dependency of the permeability number of the material exhibits an extremum in the temperature range, and wherein the nominal temperature is substantially a temperature at which the temperature dependency exhibits the extremum.

11. The particle-optical system according to claim 9, wherein the temperature-adjusting unit comprises a temperature sensor for detecting the temperature of the magnetic-flux-carrying body.

12. The particle-optical system according to claim 9, wherein the material is a soft-magnetic material.

13. The particle-optical system according to claim 9, wherein the material is a ferrite material.

14. The particle-optical system according to claim 9, wherein the system is a lithography system for transferring a pattern onto a particle-sensitive substrate using at least one writing beam of charged particles.

15. The particle-optical system according to claim 9, wherein the system is a microscopy system for inspecting an object.

16. A method of making a system for manipulating charged particles of a beam of charged particles by a magnetic field, the method comprising:

providing a magnetic field generating apparatus having a magnetic-flux-carrying body made of a material with a high permeability number and having at least one current conductor located adjacent to the magnetic-flux-carrying body, the permeability number of the material being temperature dependent, and choosing the material and an operating temperature for the magnetic-flux-carrying body such that the operating temperature is within a temperature range, in which the following applies:

$$\frac{\mu_{max} - \mu_{min}}{\mu_{max} \cdot \Delta T} = c, \text{ with } c < 3 \cdot 10^{-5} \text{K}^{-1}$$

wherein $\mu_{max}$ is a maximum value of the permeability number in the temperature range, $\mu_{min}$ is a minimum value of the permeability number in the temperature range, and $\Delta T$ is a width of the temperature range.

17. The method according to claim 16, wherein c is less than $9 \cdot 10^{-6}$ K$^{-1}$.

18. The method according to claim 16, wherein c is less than $3 \cdot 10^{-6}$ K$^{-1}$.

19. The method according to claim 16, wherein c is less than $1 \cdot 10^{-6}$ K$^{-1}$.

20. A method of making a system for manipulating charged particles of a beam of charged particles by a magnetic field, the method comprising:

providing a magnetic field generating apparatus having a magnetic-flux-carrying body made of a material with a high permeability number and having at least one current conductor located adjacent to the magnetic-flux-carrying body, the permeability number of the material being temperature dependent, and choosing the material and an operating temperature for the magnetic-flux-carrying body such that the operating temperature is within a temperature range, in which the following applies:

$$\frac{\mu_{max} - \mu_{min}}{\mu_{max} \cdot \Delta T} = c, \text{ with } c < 3 \cdot 10^{-4} \text{K}^{-1}$$

wherein $\mu_{max}$ is a maximum value of the permeability number in the temperature range, $\mu_{min}$ is a minimum value of the permeability number in the temperature range, and $\Delta T$ is a width of the temperature range, wherein a temperature dependency of the permeability number of the material has an extremum in the temperature range, and wherein the operating temperature is substantially a temperature at which the temperature dependency has the extremum.

21. The method according to claim 16, wherein the temperature number of the material is higher than 8000.

22. The method according to claim 16, wherein the permeability number of the material is higher than 10,000.

* * * * *

UNITED STATES PATENT AND TRADEMARK OFFICE
CERTIFICATE OF CORRECTION

PATENT NO. : 6,914,248 B2
DATED : July 5, 2005
INVENTOR(S) : Wilfried Clauss

It is certified that error appears in the above-identified patent and that said Letters Patent is hereby corrected as shown below:

Column 7,
Line 64, "A method of manipulating charged articles of a beam of charged articles by a magnetic field, the method comprising" should read -- A method of manipulating charged particles of a beam of charged particles by a magnetic field, the method comprising --; and Column 10,
Line 50, "The method according to claim 16, wherein the temperature number of the material is higher than 8000" should read -- The method according to claim 16, wherein the permeability number of the material is higher than 8,000 --.

Signed and Sealed this

Twenty-fifth Day of October, 2005

JON W. DUDAS
*Director of the United States Patent and Trademark Office*